United States Patent [19]

Sheets et al.

[11] Patent Number: 4,539,479

[45] Date of Patent: Sep. 3, 1985

[54] AUTOMATIC APPARATUS AND METHOD FOR EXPOSING, REGISTERING, AND HANDLING DOUBLE-SIDED PRINTED CIRCUIT BOARDS

[76] Inventors: Ronald E. Sheets, 10745 Quadrille Pl., Santa Ana, Calif. 92705; George A. Barbas, 32772 Shipside Dr., Dana Point, Calif. 92629; Howard W. Doering, Jr., 9682 Blanche Ave., Garden Grove, Calif. 92641; John R. Bjorkman, 3021 Madeira Ave., Costa Mesa, Calif. 92626

[21] Appl. No.: 559,745

[22] Filed: Dec. 9, 1983

Related U.S. Application Data

[63] Continuation-in-part of Ser. No. 470,571, Feb. 28, 1983, abandoned.

[51] Int. Cl.³ .............................................. B65G 49/06
[52] U.S. Cl. ............................. 250/491.1; 250/492.1; 198/345; 198/403
[58] Field of Search ..................... 250/491.1, 492.1; 198/345, 403

[56] References Cited

U.S. PATENT DOCUMENTS

| | | | |
|---|---|---|---|
| 3,645,581 | 2/1972 | Lasch, Jr. et al. | 406/31 |
| 3,753,484 | 8/1973 | Aiuola et al. | 198/451 |
| 3,797,889 | 3/1974 | Wilkinson | 406/34 |
| 3,930,643 | 1/1976 | Moore | 269/58 |
| 3,930,684 | 1/1976 | Lasch, Jr. et al. | 406/12 |
| 3,945,505 | 3/1976 | Frisbie et al. | 414/612 |
| 3,982,627 | 9/1976 | Isohata | 414/757 |
| 4,006,563 | 2/1977 | Charlot | 51/109 R |
| 4,015,880 | 4/1977 | Colvin et al. | 406/88 |
| 4,353,160 | 10/1982 | Armini et al. | 29/572 |

FOREIGN PATENT DOCUMENTS 0002496 6/1979 European Pat. Off. ............ 198/345

OTHER PUBLICATIONS

T. J. Cochran, A. S. Gasparri and W. G. Rance, "Inverter for Flat Parts Being Indexed on a Belt", *IBM Technical Disclosure Bulletin*, vol. 17, No. 4 (Sep. 1974), p. 1065.

Primary Examiner—Janice A. Howell
Assistant Examiner—Constantine Hannaher
Attorney, Agent, or Firm—Gausewitz, Carr, Rothenberg & Edwards

[57] ABSTRACT

In an apparatus and method for effecting automatic handling of circuit boards prior to exposing them, pins are provided that effect highly accurate location of the circuit board at an exposure station. The pins are extended through slots provided in the circuit board, at least one slot being perpendicular to the others.

Each pin is noncircular, being sufficiently small to be inserted through an associated slot when the pin is in one rotated position, but being sufficiently large that rotation of the pin about its axis will cause it to bind with the walls of the slot, so that further pin rotation is prevented. The pins are inserted into the slots when in the non-binding rotated positions, following which the pins are rotated so as to bind with the slot walls, and thereby move the board to a precisely known position relative to the axes of the pins. Thereafter, exposure of the board is effected.

12 Claims, 13 Drawing Figures

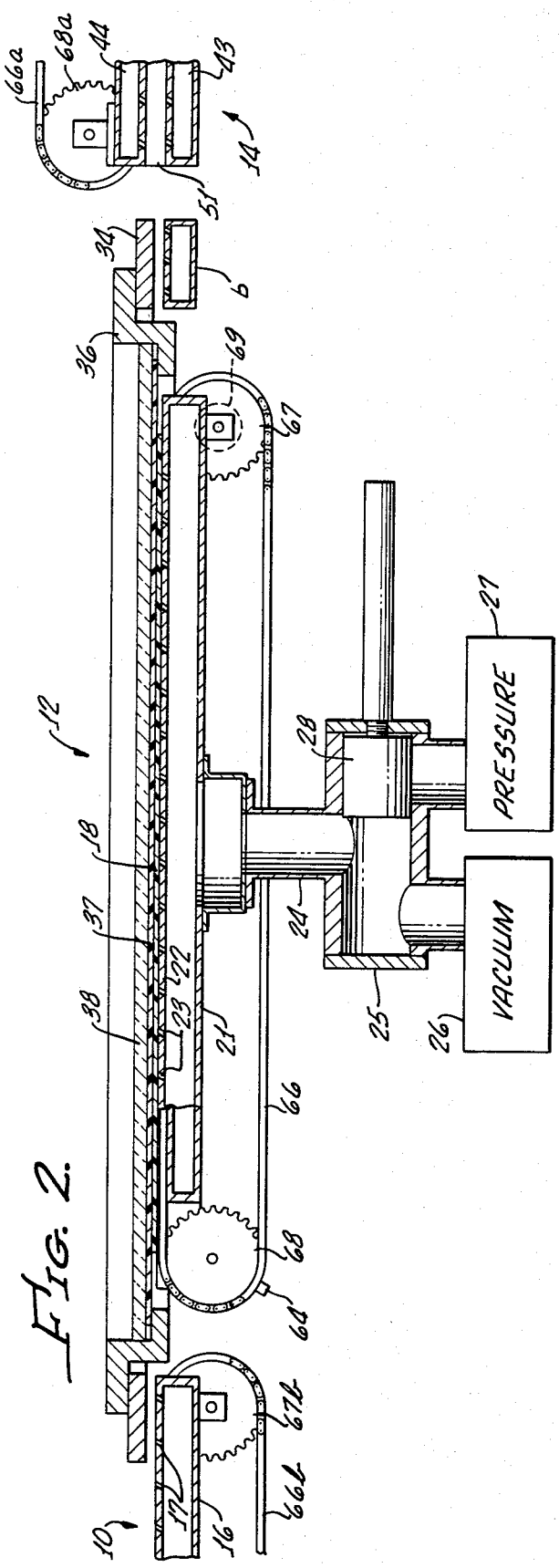
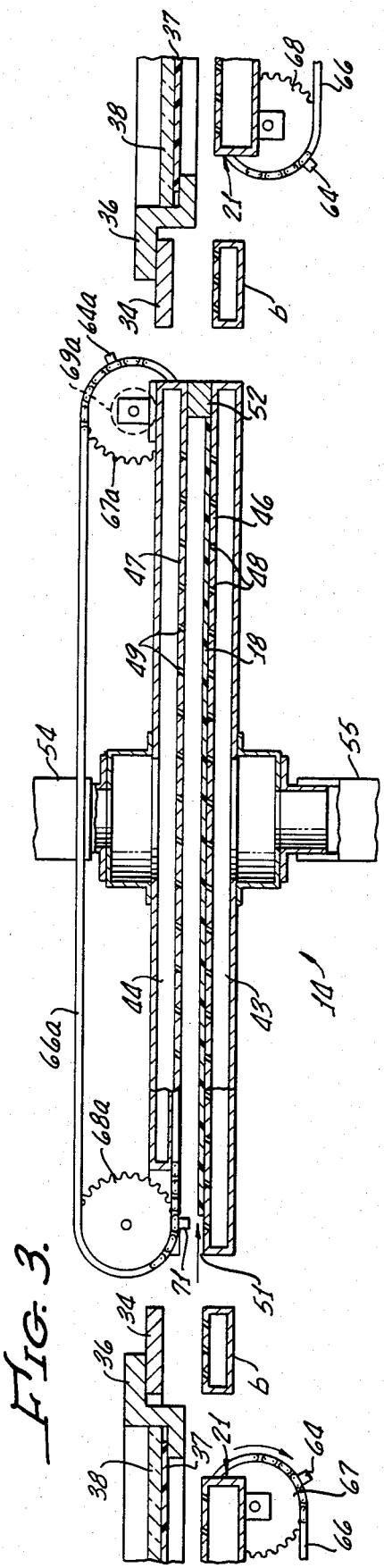
Fig. 2.
Fig. 3.

AUTOMATIC APPARATUS AND METHOD FOR EXPOSING, REGISTERING, AND HANDLING DOUBLE-SIDED PRINTED CIRCUIT BOARDS

CROSS-REFERENCE TO RELATED APPLICATION

This application is a continuation-in-part of our co-patent application Ser. No. 470,571, filed Feb. 28, 1983, for Automatic System For Exposing And Handling Double-Sided Printed Circuit Boards abandoned.

BACKGROUND OF THE INVENTION

There is a major need for a system which will automatically expose and handle double-sided printed circuit boards, especially such boards having large areas. For example, each board may be 18×24 inches in size, although much larger sizes may also be handled. The "boards" may be either relatively rigid (with typical thicknesses in the range of 0.04 inch to 0.1 inch), or they may be multilayer boards as thin as 0.005 inch.

Each side of each board is made sensitive to ultraviolet light, so that it may receive an image corresponding to that of artwork, there being one artwork (actually, a photomask) for one side and another artwork for the other side. It is extremely important that there be precise registry between the artwork and the board, so that the resulting images produced by masking and exposure will register on opposite sides of the board. Then, connections may be made through to registered portions of the electric circuits. The artwork is often extremely fine, so as to be difficult or even impossible to see with the naked eye.

It is known in the art to position circuit boards by the cooperative action of pins and of slots in the circuit board. Two of the circuit-board slots are oriented parallel to each other, while a third is oriented perpendicular to the two parallel slots, being disposed between such parallel slots and spaced from each. Pins having accurately-located positions, and having diameters matched to the widths of the slots, are then inserted through the slots in order to position the circuit board in a desired location.

The indicated prior-art approach has substantial limitations relative to precision and other factors. This is because the slot widths cannot be known with great precision, being instead within certain tolerance values. When, because of tolerances, a pin is somewhat loose in its slot, the degree of precision of circuit-board location is reduced. On the other hand, when a pin is tight in its slot, movement of the pin in a direction perpendicular to the circuit board tends to move the board in the direction of pin motion, and also tends to enlarge the slot in the region of the pin. When a pin is sufficiently large to locate the board with extreme accuracy, it is also, inherently, sufficiently large to tend to move the board when the pin is introduced into the slot.

It is to be understood that the widths of the slots may vary with different circuit-board materials, even when the same punch is used to form the slots. The widths of the slots may also vary even when the slots are formed by routing instead of punching.

The above-indicated problems are exacerbated when the board is floating on a layer of air, and does not have anything thereover to tend to hold it down (hold-down means being undesirable in that they may tend to scuff the upper side of the board). When the board is floating on air, the upward dragging action created between upwardly-moving tight pins and the walls of the slots creates a distinct undesirable lifting of the board. It is also to be understood that effecting floating of the board on air is important in order to prevent scuffing of the board when it is brought into the desired precision location due to operation of the pins. In other words, there should be no sliding of the board on a flat surface, even though the relatively small distance necessitated by the registration-creating action.

In accordance with the present invention, locater elements are inserted through slots in circuit boards in such manner as to reduce to an absolute minimum the tendencies of such elements to drag against and thus lift the board. Furthermore, and very importantly, the present invention eliminates the problem of tolerance variations in the widths of the slots. In addition, the present locater elements do not tend to bite into the slot walls, and are such as to permit downward movement of the circuit board, to a clamped position preparatory to exposure, without detracting from the registry and again without injury to the slots.

The present locater elements, and actuation-apparatus therefor, are employed in combination with air-flotation and vacuum apparatus which achieve scuff prevention while at the same time assuring that the circuit board during exposure will be—at all portions thereof—clamped firmly.

BRIEF DESCRIPTION OF THE DRAWINGS

FIG. 2, is a schematic vertical sectional view of each of the two exposure apparatuses (stations), which exposure apparatuses are preferably identical to each other;

FIG. 3 is a schematic vertical sectional view of the inverting apparatus (station), in position to receive a board from the first exposure station;

DETAILED DESCRIPTION OF THE PREFERRED EMBODIMENT

The great majority of the following detailed description constitutes background information, and description of cooperating elements, relative to the apparatus and method specifically described and claimed herein. The bulk of the elements and steps which are claimed in the appended claims are stated toward the end of this specification, under the heading "Apparatus and Method For Effecting Accurate Location and Registration Of The Circuit Boards", and under the heading thereafter, entitled "Method of Achieving Circuit Board Registration".

Reference is made to our continuation-in-part patent application filed on even date herewith, and which claims the over-all system.

Figure 1:
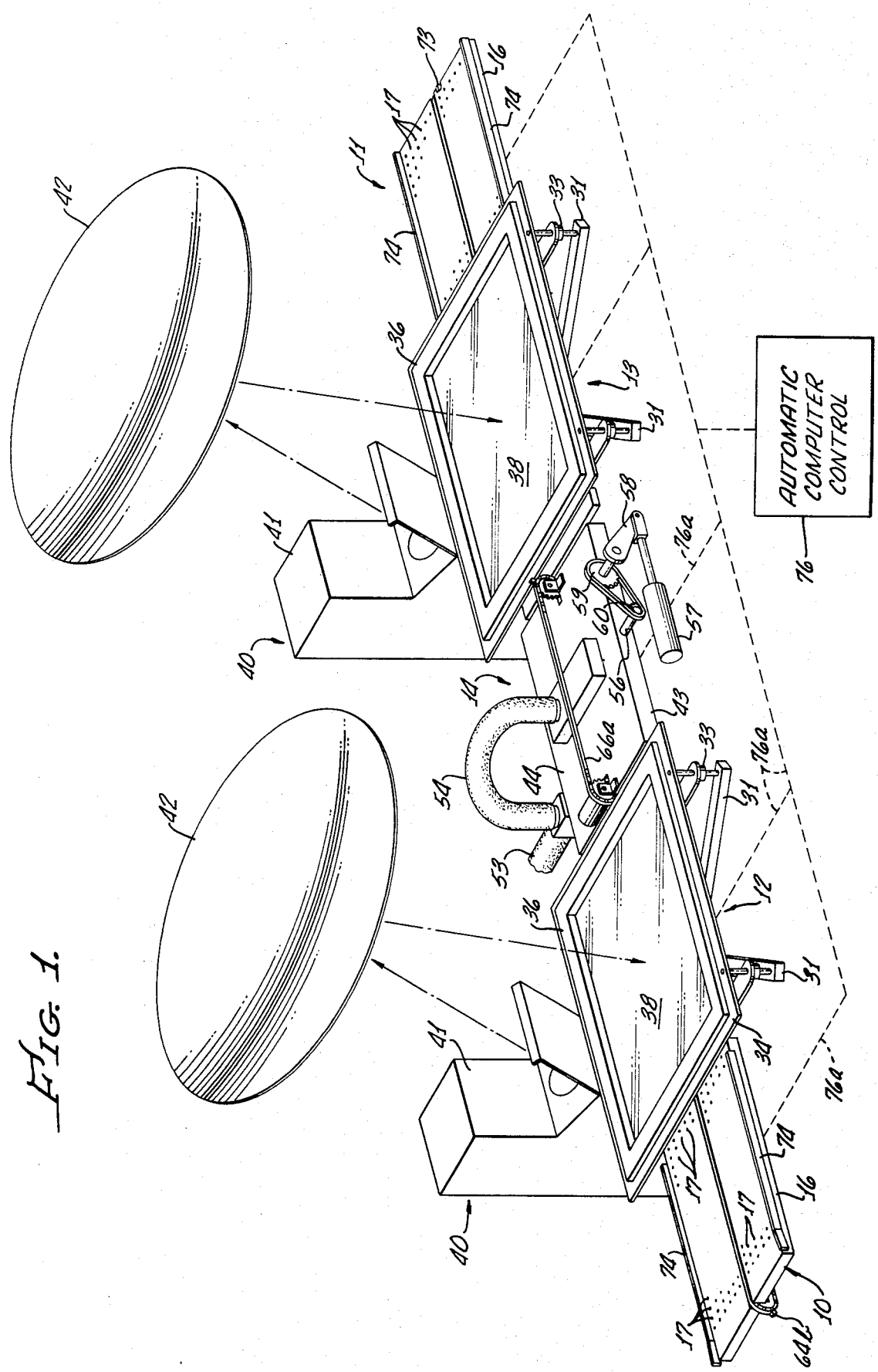
FIG. 1 is a schematic, isometric illustration of the present apparatus.

Referring first to FIG. 1, the system is illustrated schematically to comprise a loading apparatus (station) 10 and an unloading apparatus (station) 11, such apparatuses being substantially identical to each other and being at opposite ends of the in-line system described herein.

The system further comprises first and second combination exposing and conveying apparatuses (stations) 12 and 13, respectively. The apparatuses 12 and 13 are substantially identical to each other and are displaced inwardly of the loading and unloading apparatuses 10 and 11, the first exposing and conveying apparatus 12 being adjacent and downstream of loading apprartus 10, while the second exposing and conveying apparatus 13 is located adjacent and upstream of the unloading apparatus 11.

Apparatuses 12 and 13 are spaced apart, and there is disposed therebetween a combination inverting and conveying apparatus (station) 14.

All of the apparatuses 10-14 are disposed on suitable support means, not shown. Furthermore, a light-tight housing is provided to enclose apparatuses 12-14. The loading apparatus 10 is upstream of and outside the housing. The housing, and some of the elements within it, incorporate cooling means. Furthermore, means are provided to effect continuous exhausting of the housing, so as to remove therefrom ozone and also any escaped gases that could result from breakage of one of the light sources disposed therein. The exhausting is to ambient atmosphere, outside the room in which the system is located, so that there is no danger to any worker.

In the following detailed description, there will first be described the various elements 10-14, excepting only those portions thereof which effect conveying and locating of the circuit board. Thereafter, the conveying and locating means incorporated in all of the apparatuses 10-14 will be described, following which there will be descriptions of the operation and method, and of positioning mechanisms and method.

Figure 4:
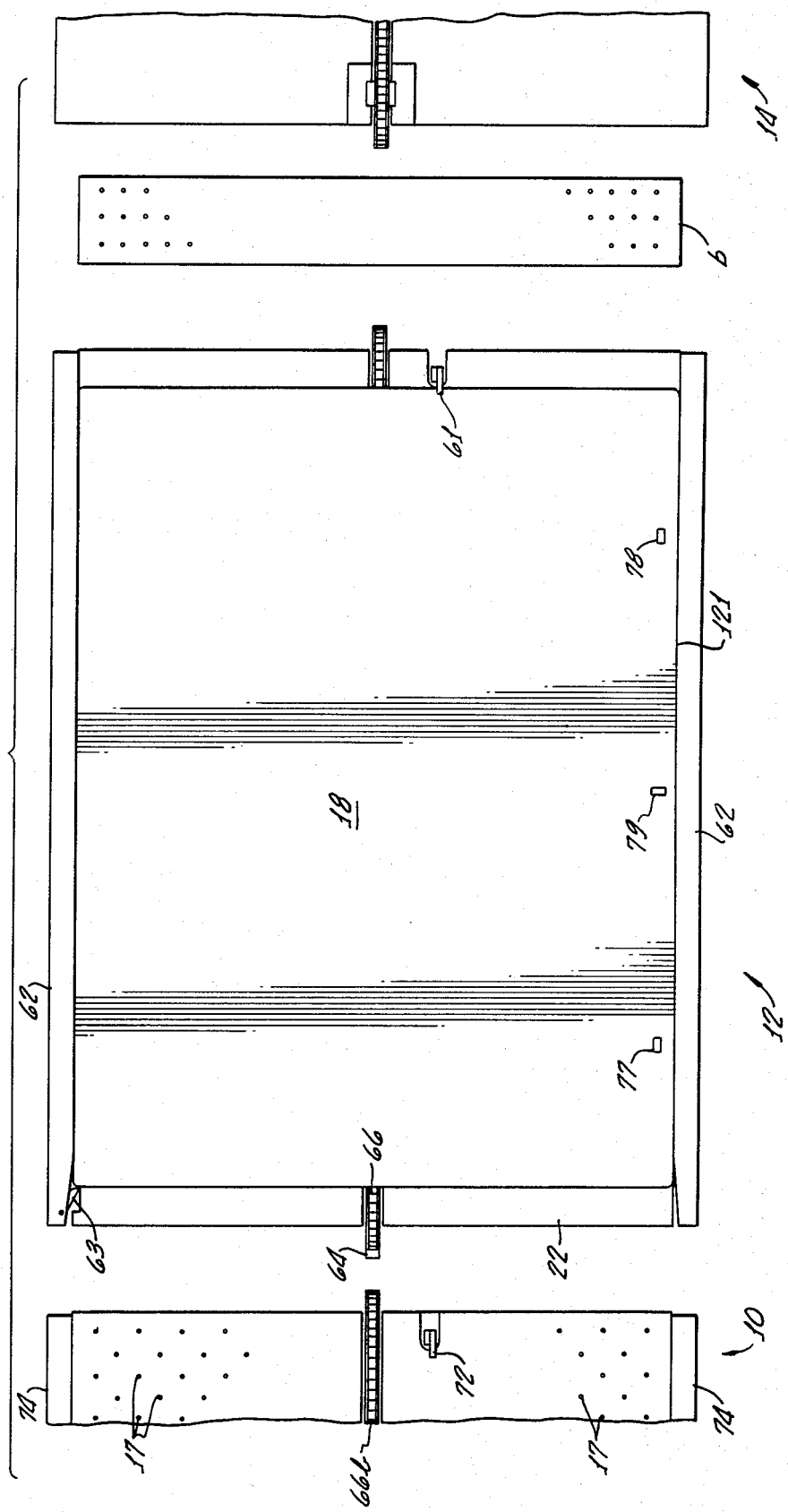
FIG. 4 is a plan view illustrating certain portions of each exposure apparatus, and further showing adjacent elements.
Figure 5:
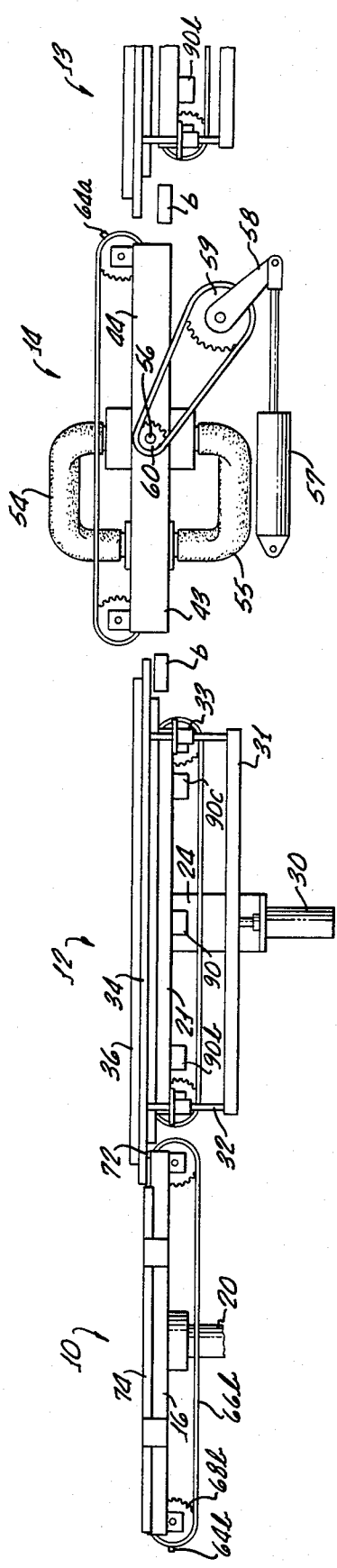
FIG. 5 is a schematic front elevational view illustrating the operation of upstream and central portions of the system.
Figure 6:
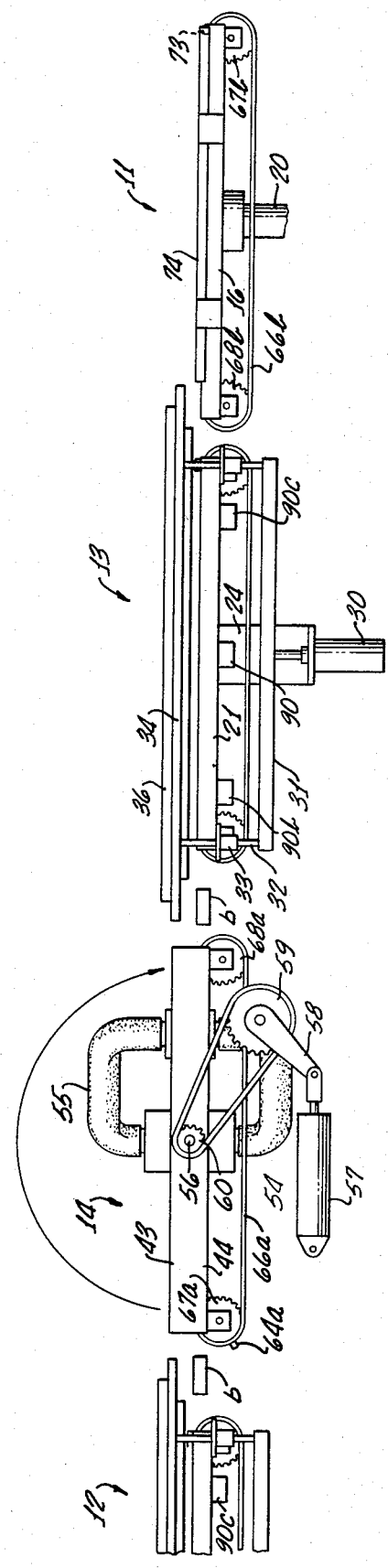
FIG. 6 is a schematic front elevational view illustrating operation of central and downstream portions of the system.

Referring to FIGS. 1, 5 and 6, each of the loading and unloading apparatuses 10 and 11 is mounted on a suitable support extending from the housing for elements 12-14, protruding longitudinally from such housing. Each apparatus 10 and 11 comprises an air box 16 having a flat upper surface which is perforated by a large number of ports 17. The ports are equally spaced throughout the entire upper surface of box 16, beneath all regions of the printed circuit board adapted to be disposed thereon. The board (substrate) is numbered 18 and illustrated in FIGS. 2-4.

Very preferably, the upper surfaces of all of the board-supporting components of the present system are horizontal, flat and at the same elevation at all times—excepting only surfaces within combination inverting and conveying apparatus 14 during actual rotation thereof. Such an orientation of the flat surfaces permits, for example, use of gravity at certain regions and portions of the apparatus and method.

Each air box 16 is supplied with air through an air conduit 20 (FIGS. 5 and 6) from a suitable source of air pressure. The air passes out through ports 17 and effects air-bearing support of the boards 18.

Description of the Exposing and Conveying Apparatuses 12 and 13

The apparatuses (stations) 12 and 13 being identical to each other, only the first or upstream one, number 12, will be described.

Referring to FIGS. 1, 2 and 5, apparatus 12 comprises an air box 21, the horizontal upper wall 22 of which forms a stage for a board 18 supported thereon. A large number of ports 23 are provided in wall 22 and are spaced about the entire region beneath substrate 18. Air-conduit means 24 (FIG. 2) connect the interior of box 21 to a shuttle valve 25 and thus to a vacuum source 26 and a pressure source 27. Valve 25 has a spool or piston 28 adapted to be operated back and forth between extreme positions, at one of which the pressure source 27 is blocked while at the other of which the vacuum source 26 is blocked.

An air cylinder 30 (FIG. 5) is connected to an X-frame 31 (FIGS. 1 and 5) on which rest, at the ends of the arms of the X, vertical pins 32 that extend upwardly through bearings 33, the latter being fixed adjacent the bottom of air box 21. At their upper ends, pins 32 connect to an artwork (artwork assembly) carrier 34 on which is adjustably mounted an artwork frame 36 shown in FIGS. 1 and 2. The illustrated artwork frame 36 has, as shown in FIG. 2, a generally Z-shaped section.

The inner regions of frame 36 adjustably support the artwork (photomask) 37 having the light-permeable electric-circuit lines very finely provided thereon. Artwork 37 may be adhered to the underside of a plate formed of glass or other light-transmissive material. Alternatively, it may be provided in a film of synthetic resin and which is secured to the underside of a glass (or other light-transmissive material) as by a vacuum line and suitable grooves, not shown. The "glass" is numbered 38. Alternatively, an etched chrome film may be on the glass itself.

Apparatus 12 further comprises an ultraviolet light source 40, preferably of a sophisticated type known in the art. In such apparatus, there is located in the housing 41 a high-pressure mercury or mercury-xenon lamp, a high efficiency ellipsoidal reflector, two dielectric cold mirrors, an air-operated high-speed shutter, and a lenticular (fly's eye) optical integrator. Light from the various portions of the optical integrator is directed to a collimation reflector 42 which bends the light rays down onto the glass 38 so that the light passes through the glass and through the lines in the artwork and then engages corresponding portions of the board 18 to expose the same. Such exposing does not occur until after cylinder 30 has been operated to lower the elements 34, 36, 38 and 37 until the lower surface of the artwork 37 is in proximity to the upper surface of board 18.

Description of Combination Inverting and Conveying Apparatus 14

As best shown in FIGS. 1 and 3, the combination inverting and conveying apparatus (station) 14 comprises a double or "sandwich" air box having first and second stations 43 and 44, respectively. Such sections have, respectively, opposed parallel flat walls 46 and 47, the facing surfaces of which are disposed a substantial distance apart, for example three-quarters inch. Such walls are perforated, respectively, by large numbers of ports 48 and 49.

One end of the opening (chamber) formed between walls 46 and 47 is open and forms a mouth numbered 51 in FIG. 3. When the apparatus 14 is in its normal position, such mouth faces and is registered with the gap between apparatus 14 and and the apparatus 12 on the upstream side thereof. At the other end of the opening or chamber formed between walls 46 and 47, there is a stop 52, as shown in FIG. 3.

A source of air is connected to apparatus 14 through a conduit 53 (FIG. 1), from which it passes through parallel hoses 54 and 55 to the second and first air-box sections 44 and 43, respectively.

Means are provided to effect 180°-rotation of the double air box 43-44 about a horizontal axis. Preferably, such rotation is about an axis lying substantially in the plane of the upper surfaces on which the boards 18 are supported, and perpendicular to the longitudinal axis of the system. The axis of rotation of the double air-box apparatus is preferably located at 56 (FIGS. 1 and 5), there being a shaft and suitable bearings provided for that purpose. The drive means to effect the (preferably) end-over-end rotation of double air box 43-44 comprises a cylinder 57, the piston rod of which connects to a crank 58 on a shaft. The shaft has a large sprocket 59 thereon and connecting through a chain to a small sprocket 60. The large and small sprockets create a two-to-one speed change, so that a 90° rotation of crank 58 causes a 180° rotation of the shaft for the double air box 43-44. After such rotation, the mouth 51 is adjacent and faces the second exposing and conveying apparatus 13.

Description of Portions of the Conveyor Apparatus, Locating Apparatus, and Method The conveyor and locating apparatus associated with all of the above-mentioned apparatus 10-14, and which is additional to the components previously described, will now be set forth.

Reference will first be made to the apparatus of FIGS. 2 and 4, and which relates to the first exposing and conveying station 12, since such is exemplary of conveyor portions of other apparatus or stations. As shown in FIG. 2, the ports 23 are inclined in a downstream direction, by which it is meant that the air emanating from air box 21 is directed to the right (toward the discharge end of the system) when it flows upwardly and against the underside of the board 18. Accordingly, the board 18 not only floats on the air but is also actuated in a downstream direction, due to the frictional relationship between the air and the undersurface of the board. Nevertheless, the board is constrained against moving in a downstream direction, because its forward edge is then abutted against a stop means 61 shown in FIG. 4. Stop means 61 is not permanently affixed, but instead is retractable to a position beneath the upper surface of wall or stage 22 when it is desired that the board 18 move out of the exposure apparatus. Movement of stop 61 may be effected, for example, by a cylinder or solenoid, not shown.

Retractable side rails 62 (FIG. 4) are adapted to move vertically between an upper position at which they guide the side edges of board 18, and a lower position at which they are retracted below the upper surface of stage or wall 22. Upward and downward movement of the side rails 62 is effected by suitable cylinder or solenoid apparatus, not shown.

One of the side rails 62 has mounted therein a ratchet element 63 which is spring-loaded inwardly by a very weak spring. As shown in FIG. 4, the ratchet element is in its inner position after the board (represented at 18) shifts therepast in a downstream direction. While the board is shifting past the ratchet, the edge of the board maintains the ratchet in a retracted condition, following which the ratchet springs out. Ratchet element 63 is operative to prevent rebound or bouncing of the board backward (upstream) after it strikes the stop 61.

Despite the presence of the air bearing, there is usually some small edge or corner portion of board 18 which physically touches an adjacent element, either the wall 22 or one of the rails 62, creating sufficient drag that there is no assurance the board 18 will start to move out of the apparatus after stop 61 is retracted. Particularly in the case of very thin "boards", different regions of the edges or corners tend to shift at certain times into engagement with adjacent elements and cause sufficient friction to prevent the board from moving as desired. For these reasons, the present invention further provides an actuator lug or dog 64 which is mounted at one point along an endless chain 66, the latter being on sprockets 67 and 68 that are rotatably supported by bearings connected to air box 21.

The upper run of chain 66 is disposed in a groove or depression in the wall or stage 22, the relationship being such that the chain 66 never contacts board 18.

Chain 66 is driven by a motor 69 (FIG. 2) and is associated with suitable limit switches such that, each time motor 69 is started, the chain is operated for only one full cycle. Thus, dog 64 is caused to move upwardly and to the right, then downwardly and to the left, back to the illustrated position, at which time the motor 69 becomes de-energized and movement of dog 64 ceases.

In the operation of the apparatus, stop 61 is retracted when it is desired that board 18 move out of apparatus 12, and such movement may occur immediately due to the action of the air emanating through ports 23 from air box 21. Frequently, however, the board does not move until motor 69 has been energized to drive chain 66 and thus lug 64 upwardly until the latter engages the rear edge of board 18 and positively shifts the same in a downstream direction. Once the board starts to move, the air emanating from the inclined ports 23 normally causes the board to move faster than the lug 64, so that the board moves and floats into the mouth 51 of inverting-apparatus 14 and thus into the chamber formed between the air-box sections 43 and 44 of such apparatus. In thus moving into the inverting apparatus 14, or (subsequently) out of such apparatus, the board 18 passes over air-bearing elements "b" (FIGS. 2-6) which are disposed on opposite sides of the apparatus 14. Such apparatus b is hollow and has upper surfaces containing ports inclined in a downstream direction, there being air introduced constantly so as to cause the board to both float and move into or out of the inverting apparatus.

Referring next to the inverting apparatus or station 14, when the air-box sections 43 and 44 are in the position shown in FIGS. 1 and 3, the lower wall 46 has ports 48 inclined to the right, the air emanating from box section 43 being directed toward the permanent stop 52.

The ports 49 in the upper wall 47 (when the apparatus is in the position of FIG. 3) also incline toward the right, so that the air emanating from the air-box section 44 moves upstream or to the left (toward mouth 51).

When a board 18 is introduced through mouth 51 as described above relative to FIG. 2, gravity causes such board to be relatively adjacent the lower wall 46. Thus, the air emanating from ports 48 in the lower wall are operative to shift the board in a downstream direction (to the right) until stop 52 is engaged. However, after the apparatus has been rotated 180° in response to operation of cylinder 57 (FIG. 1), the board 18 falls by gravity toward wall 47 but does not contact such wall due to the air-bearing operation of air emanating from ports 49 therein. Such air immediately, after the inverting has been completed, tends to shift the board 18 out through mouth 51 and toward the second conveying and exposing apparatus 13 on the downstream side of the inverting apparatus. Such movement is, however, prevented by a retractable stop 71 which is mounted in wall 47 relatively adjacent mouth 51. As in the case of stop 61 indicated relative to FIG. 4, stop 71 is retractable by suitable cylinder or solenoid means, not shown.

There is mounted on air-box section 44 a positive-actuating apparatus corrsponding to that described relative to elements 64 and 66–69 of FIGS. 2 and 4. Corresponding elements in FIG. 3 have been given numbers corresponding to those in FIGS. 2 and 4 relative to such apparatus, except that each number is followed by the letter "a". Such positive-actuating apparatus effects positive shifting of substrate 18 out of the apparatus 14 despite any tendency of a corner or edge thereof to drag or become hung up. As previously described, no portion of chain 66a ever touches the board 18, the only contact being between lug 64a and the inner edge of board 18 in order to start movement thereof so that the air pressure of air emanating through ports 49 dischages the board into the second exposure station or apparatus 13.

Retractable stops 72 and 73 are mounted, respectively, on the downstream ends of loading apparatus 10 and unloading apparatus 11, as illustrated in FIGS. 1 and 4–6. Each of these stops is retractable by a suitable solenoid or cylinder, not shown. Also, side rails 74 are provided on the loading and unloading apparatus 10 and 11, to guide the substrates into and out of the machine.

Furthermore, each apparatus 10 and 11 incorporates positive-actuation apparatus corresponding to that described relative to numbers 64 and 66–69 in FIGS. 2 and 4. Such positive-actuation apparatus has been given the same numerals as employed relative to such FIGS. 2 and 4, except followed in each instance by the letter "b".

Description of Operation and Method

All of the various elements are controlled by a control system, incorporating sensing means, microprocessor means, actuating means, etc., all indicated schematically at 76 in FIG. 1. There are large numbers of conections from apparatus 76 to different portions of the systems, and some of these connections are represented schematically by the dashed lines 76a in FIG. 1.

Let it be assumed that, initially, the machine is empty and that all components thereof are in the positions shown in FIG. 1.

A board 18 is then received on the loading apparatus from an adjacent piece of equipment in the production line, passing over the lug 46b which is then protruding horizontally as shown, and being guided by the side rails 74. Because of air emanating from ports 17, which are inclined in a downstream direction (to direct air toward exit station 11), the board keeps moving until it comes to rest with its forward edge abutting stop 72 (FIGS. 4 and 5).

At this time, the elements in the first exposing and conveying apparatus 12 are in the following conditions: (1) Air cylnder 30 (FIG. 5) has been operated to cause frame 31 and pins 32 to lift artwork carrier 34 and thus glass 38 and artwork 37 upwardly, providing space for ingress of a board 18 from loading station 10. (2) Stop 61 (FIG. 4) has been actuated upwardly, as have side rails 62 in such Figure. (3) Valve element 28 (FIG. 2) is in a position opposite to the one illustrated in that Figure, so that pressure source 27 is connected through conduit 24 to air box 21, air then flowing upwardly through ports 23 and in a downstream direction. (4) Lug 64 is in the left position shown in FIG. 2.

Thereafter, stop means 72 in the loading station 10 (FIG. 5) is actuated to a retracted position below the upper wall of air box 16. Furthermore, the motor drive for chain 66b shown in FIG. 5 is operated to effect upward and rightward movement of lug 64b until in engages the rear edge of board 18 on apparatus 10. Such engagement, in combination with the movement of air through the upper wall of air box 16 by way of ports 17, which incline toward the discharge end of the apparatus, effects shifting of substrate 18, without causing any scuffing thereof, into the first exposing and conveying apparatus 12 until stop 61 in such apparatus is engaged (FIG. 4). The board "floats" into the apparatus 12 due to the upward movement of air through ports 23 from air box 21. As shown in FIG. 4, the ratchet 63 prevents bounce or rebound of board 18 away from stop 61, despite the fact that the board is moving relatively rapidly when the stop 61 is engaged.

The stop 61 and ratchet 63 cooperate with each other, and with side rails 62 (FIG. 4), to provide a coarse positioning of board 18 in apparatus 12. There is then automatically effected a fine positioning of the board in such apparatus. This may be accomplished in different ways, either by T.V. monitoring, or by use of positioning pins which are known in the art and extend upwardly through slotted regions of the board 18. Three such slots 77–79 are shown in FIG. 4, with slots 77 and 78 being aligned longitudinally of the board, and slot 79 being aligned perpendicularly thereof. The positioning pins are automatically driven upwardly into the slots 77–79 and effect precise positioning of board 18 over the underlying stage. A greatly-preferred positioning-pin mechanism (and method) is shown in FIGS. 7–13, inclusive, and described in related descriptive material at the end of this specification.

At this time, shuttle valve 25 is operated to shift the spool or piston element 28 back to the one illustrated in FIG. 2. Thus, pressure source 27 is blocked and vacuum source 26 is opened to the interior of air box 21. The result is that a suction effect is created above ports 23 to draw the board downwardly into close engagement with the uppe surface of wall or stage 22. The board is thus held firmly in the registered position created by the registry means. The latter then may be—and are—moved out of the slots 77–79 to retracted positions below the stage. At the same time, stop 61 and rails 62 are lowered to their retracted positions.

There is then no impediment to downward movement of the assembly including artwork carrier 34, frame 36, glass 38, and artwork 37. Air cylinder 30 (FIG. 5) is then operated to lower such elements by lowering X-frame 31 and pins 32, until the lower surface of the artwork is in the desired proximity with the upper surface of board 18.

The next step is to commence operation of light source 40 (FIG. 1) to cause exposing of the board through the artwork. Thereafter, cylinder 30 (FIG. 5) is operated to raise the artwork and associated elements, providing clearance for discharge of the board from the first exposure and conveying apparatus. At this time, the vacuum source remains on and therefore holds down the board, despite the tendency of the artwork to "suck" the board up. Thereafter, guide rails 62 (FIG. 4) are raised, and shuttle valve 25 is again operated to connect pressure source 27 to air box 21. Furthermore, motor 69 is energized to drive lug 64 (FIG. 2). The cooperative action of the lug 64 and air emanating from ports 23 shifts the board 18 out of apparatus 12 and into the mouth 51 of inverting and conveying apparatus 14. The board 18 floats above element b and above wall 46 of apparatus 14 (FIG. 3) and thus moves entirely into the chamber of the inverting apparatus until stop 52 is engaged. At this time, and before, air is entering through both sections 43 and 44 of the double air box of apparatus 14, from air inlet 53 and through hoses 54 and 55.

The cylinder 57 (FIG. 1) of apparatus 14 is immediately operated to effect, through crank 58, and sprockets 59 and 60, 180° clockwise rotation of the double air box 43–44 until mouth 51 faces apparatus 13 instead of apparatus 12. As described above, this rotation is effected in the absence of any scuffing of the board.

As the full 180° rotation of apparatus 14 is approached, the board 18 falls by gravity into a position adjacent, but not in substantial contact with, wall 47 of such apparatus. The air emanating through ports 49 of apparatus 14 then tries to shift the board 18 out of apparatus 14, but this is prevented by stop 71 (FIG. 3) which is then not retracted but instead in extended position in front of the downstream edge of board 18 to prevent movement of the board. (It is to be remembered that the parts have at this time been rotated clockwise 180° from the position shown in FIG. 3, and as indicated by the arrow in FIG. 6.)

At this time, the components or elements in the second exposure and conveying apparatus 13 are in the same positions as were those in the first apparatus 12 prior to introduction of the first board into such apparatus 12. Furthermore, the elements in apparatus 12 are again in their above-indicated positions adapted to receive a board from loading apparatus 10 as previously described, such a board having been received from the equipment upstream from the one described in this specification.

Substantially simultaneously, therefore, the system is operated to effect loading of both apparatuses 12 and 13 from the elements upstream therefrom, namely from loading station 10 and from inverting apparatus 14. The loading from apparatus 14 is accompanied by retraction of pin 71, and operation of chain 66a, of such apparatus. Thereafter, exposures are effected simultaneously at both stations 12 and 13 as described previously relative to the exposing in station 12. Thus, the apparatus simultaneously exposes two sides of two boards.

After exposing has occurred, the elements in stations or apparatuses 12 and 13 move to their positions permitting discharge of the boards therefrom, one such board entering the mouth 51 of inverting apparatus 14 (such apparatus having been rotated back to the position shown in FIG. 1 just as soon as the board was discharged therefrom to station 13), and another such board discharging from station 13 onto the discharge apparatus 11.

The operation then continues automatically, with two simultaneous exposures of two boards, followed by rapid movement of the boards to the next station.

The speed of operation is limited primarily by the amount of power which it is desired to introduce into the light sources 40. The present apparatus will, depending upon exposure energy, expose at least 150 panels per hour and in many cases over 200 panels per hour.

It is pointed out that the light sources 40 and reflectors 42 are relatively large and require much space. With the present apparatus, these elements (particularly the reflectors 42) may both be located on the same side of the line of movement of the boards, namely above the boards so that the latter may be close to the ground and readily accessible for adjusting and servicing.

The present apparatus thus replaces the clumsy, cumbersome apparatus of the prior art by an automated, in-line, very safe and highly effective apparatus for effecting rapid exposing of printed circuit boards. The movement of each board through the system is substantially entirely translational except during inverting.

Mechanism and Method For Effecting Accurate Location and Registration Of The Circuit Boards Referring to FIGS. 5 and 6, locater mechanisms, 90, 90b and 90c, are mounted on each of the combination exposing and conveying apparatuses 12 and 13. The construction and arrangement of the mechanisms on apparatus 12 are identical to those on apparatus 13, so only one will be described.

Figures 7, 8:
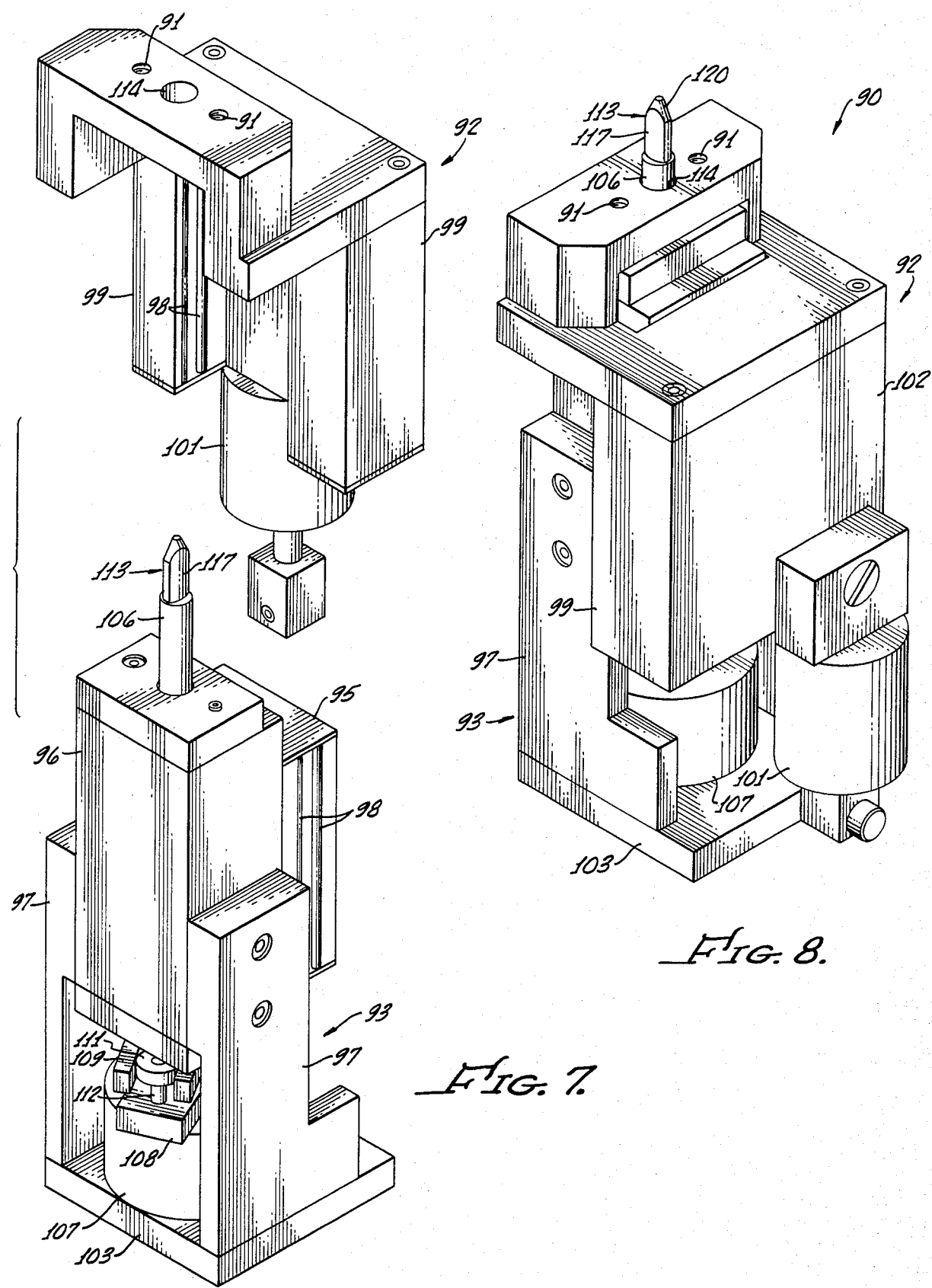
FIG. 7 is a partially-exploded isometric view of a greatly preferred mechanism for positioning the circuit boards.
FIG. 8 illustrates the mechanism of FIG. 7 in fully-assembled condition, ready to be mounted on a portion of the exposure apparatus.
Figure 9:
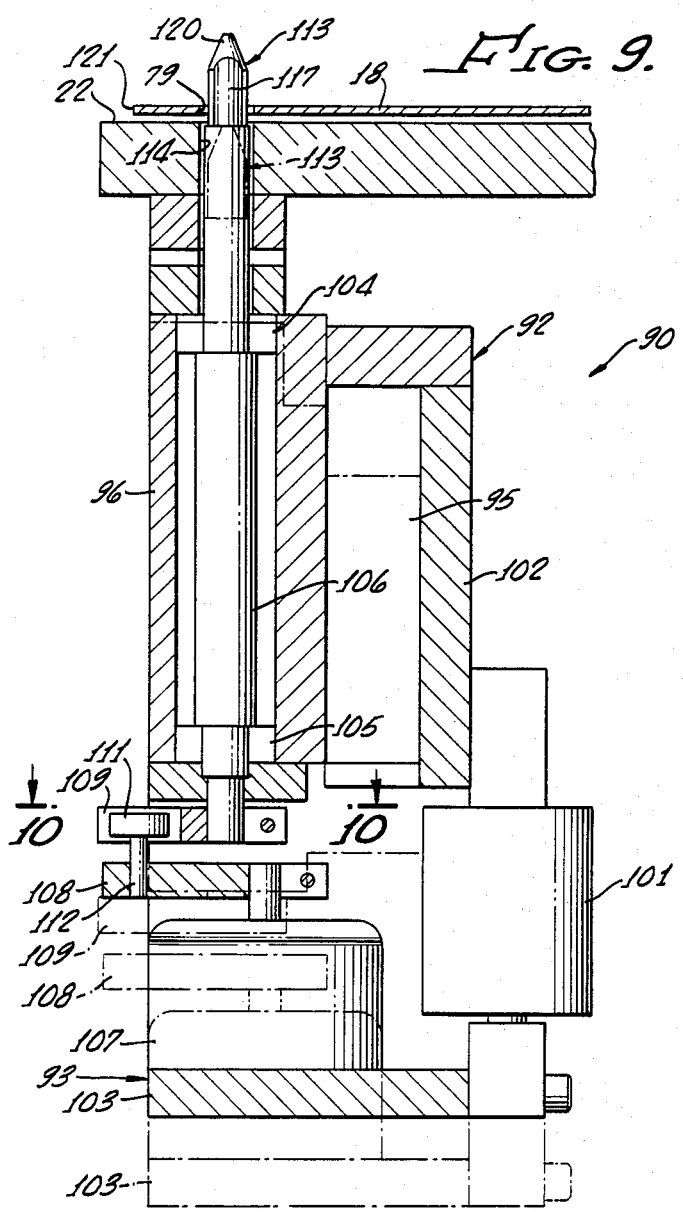
FIG. 9 is a vertical sectional view of the showing of FIG. 8, and showing the positioning mechanism mounted at an exposure station.

FIGS. 8 and 9 show one of the mechanisms, namely number 90, in assembled condition. Such mechanism 90 is suspended from an overhanging edge region of upper wall 22 of air box 21, the relationship being such that operation of the air box 21 to create air-flow and vacuum effects at desired times is not interfered with. In the present apparatus, the suspension of the mechanism 90 from wall 22 (FIG. 9) is effected by screws, not shown, having heads which are recessed into the upper part of wall 22 and having threaded shanks which thread downwardly into internally-threaded vertical bores 91 shown in FIGS. 7 and 8.

As best shown in FIG. 7, mechanism 90 includes (in addition to other elements) an upper frame 92 which is fixedly mounted to air-box wall 22 in suspended relationship as described, and a lower frame 93 adapted to be moved upwardly and downwardly relative to the upper frame, in high-precision manner.

Stated more definitely, a high-precision linear ball-bearing slide 95 is bolted to a high-precision rotary bearing 96, the latter in turn being bolted between upwardly-extending sides 97 of lower frame 93. The linear slide means 95 includes race rails 98 (FIG. 7) which are opposed to race rails 98 on side walls 99 of upper frame 92. The race rails 98 confine the balls, not shown, of the linear ball-bearing slide when the mechanism 90 is in the assembled condition of FIGS. 8 and 9, so that high-precision vertical movement of lower frame 93 and associated components is achieved when suitable actuating means are operated.

The illustrated actuating means comprises an air cylinder 101 which is bolted to a back wall portion 102 of upper frame 92. The piston rod of cylinder 101 is bolted to the bottom wall 103 of lower frame 93.

Referring next to the rotary bearing 96, this high-precision element includes precision ball bearings 104, 105 (FIG. 9) which rotatably support a vertical shaft 106. The lower end of the shaft is connected through an adjustable coupling mechanism to the vertical shaft of a rotary solenoid 107 mounted on bottom wall 103. Solenoid 107 is a D.C. solenoid the torque of which is varied in accordance with the applied voltage. When the desired voltage is applied, the rotary core of the solenoid attempts to turn through an angle which may approach 90°, against the bias of a return spring (not shown) disposed within the housing of the solenoid.

Figure 10:
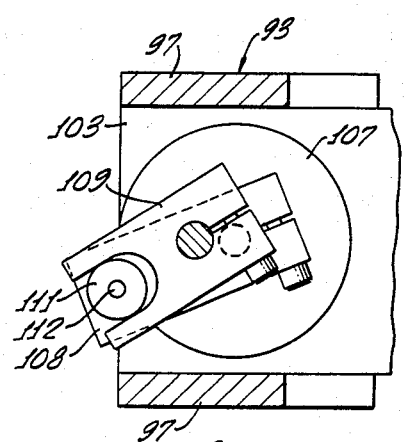
FIG. 10 is a fragmentary transverse sectional view taken on line 10—10 of FIG. 9.

The adjustable coupling mechanism, which connects the vertical output shaft of solenoid 107 to the lower end of shaft 106, is illustrated in FIG. 10 to comprise two adjustable cranks and a bearing-and-yoke connector. One crank, numbered 108, is clamped to the solenoid shaft, while a second crank, numbered 109, is clamped to the lower end of shaft 106. At its outer end, the second crank 109 is bifurcated for reception of a ball bearing 111, the central region of such bearing being connected through a pin 112 to solenoid crank 108.

All of the mechanism thus-far described under the present subhead is adapted to achieve high-precision axial and rotary movement of shaft 106, and thus of a locater element 113 provided at the upper end of shaft 106. As shown in FIG. 9, upward and downward movement of the lower frame 93 and associated components, in response to operation of air cylinder 101, causes locater 113 to move first upwardly to the solid-line position shown in FIG. 9, well above the upper surface of air-box wall 22, and then to move downwardly to the retracted position in phantom in FIG. 9. Such movement is through a vertical bore 114 in air-box wall 22, and also through a slot 79 (FIGS. 4, 9 and 11) in circuit board 18.

Locater element 113 is, very preferably, a pin of predetermined shape. The pin (or other locater element) 113 has slot-wall-engagement portions 115 (FIG. 13) that are spaced equal distances on opposite sides of a plane containing the axis of rotation, and also are spaced equal distances on opposite sides of another plane containing the axis of rotation, such second-mentioned plane being perpendicular to the first. (In engineering terms, the axis of rotation is at the zero point of a hypothetical graph, and the portions 115 have identical X and Y coordinates, one set of coordinates being positive and the other negative.)

Figure 13:
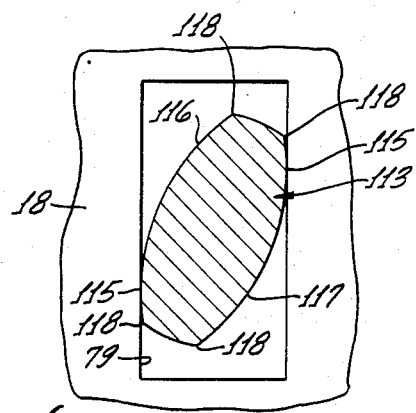
FIG. 13 is a greatly enlarged view of the central region of FIG. 12.
Figure 11:
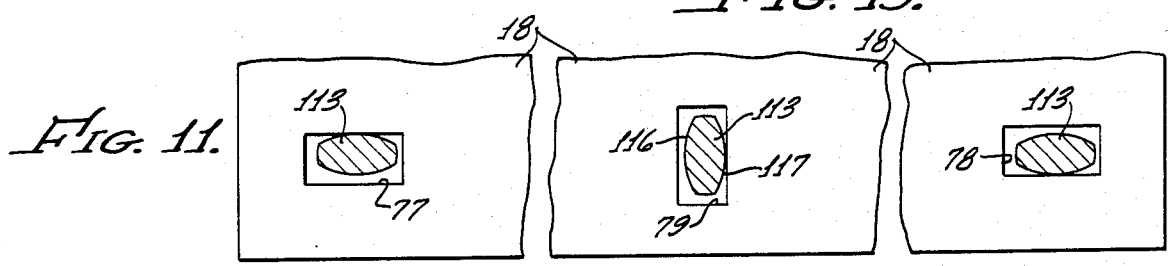
FIG. 11 is fragmentary plan view corresponding to a lower portion of FIG. 4, and showing in horizontal section the greatly-preferred elements for effecting registration of the boards, the elements being shown in positions assumed during insertion upwardly through a board.
Figure 12:
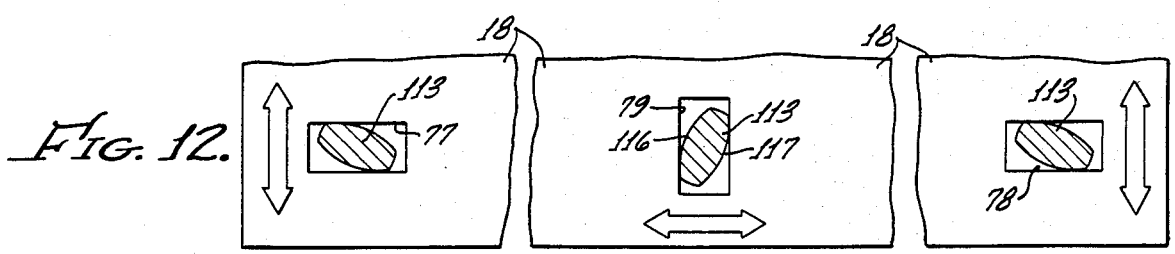
FIG. 12 corresponds to FIG. 11 except that it shows the position of the elements and board after precise registration has been achieved.

As shown in FIGS. 11–13, pin 113 in the illustrated, preferred, form has accurately-machined, corresponding, opposed, convex side walls 116 and 117. The side walls are, very precisely, mirror images of each other relative to a plane containing the common axis of pin 113 and shaft 106, which plane lies midway between the edge or corner portions 118 of the side walls (FIG. 13).

Each side wall 116–117 has, in the illustrated form, corresponding portions which are mirror images of each other relative to a plane containing the axis of pin 113 and perpendicular to the last-mentioned plane.

As a specific example, which is given by way of illustration only, each side wall 116–117 is a section of a cylinder having a diameter of 0.250 inch, and the opposed corners 118 are disposed 0.08 inch from each other. The distance between the side walls of each board slot 77–79 may be approximately 0.187 inch but this varies because of the manufacturing tolerances, as described.

At its extreme upper end, pin 113 is conical so as to be upwardly convergent to a relatively pointed region 120.

The described pin mechanism 90 is so constructed that pin 113 has a normal or rest position perpendicular to the side edge 121 of circuit board 18, because slot 79 (FIGS. 4, 9 and 11–13) is perpendicular to such side edge. When solenoid 107 is actuated, pin 113 pivots clockwise as far as it can, that is to say as far as is permitted by the side walls of slot 79. The amount of pin rotation is not controlled by the solenoid 107, but solely by the engagement of curved wall-engaging cam regions 115 of pin side walls 116–117 with the opposed parallel walls of slot 79, as shown best in FIG. 13.

The two remaining pin mechanisms, which are numbered 90b and 90c in FIGS. 5 and 6, are identical to the above-described mechanism 90, with one exception. That exception is that the normal or rest position or each pin 113 of mechanisms 90b and 90c is parallel to the side edge 121 of circuit board 18, instead of being perpendicular as is the case relative to pin 113 of mechanism 90. Stated otherwise, and again referring to FIGS. 4, 11 and 12, the rest positions of the outer (left and right) pins 113 are parallel to the side edge 121 of the circuit board because the slots 77 and 78 in which such pins 113 are mounted have their major axes parallel to such side edge.

Method of Achieving Circuit Board Registration

The following method description augments, and is to be considered in conjunction with, the previous method description described above, primarily under the subheading "Description of Operation and Method".

As previously described, a circuit board 18 is floated and actuated by the upwardly-flowing air and by lug or dog 64 (FIG. 2) onto one of the exposing and conveying stations, for example the first station 12 shown in FIG. 2. Movement continues until stop 61 (FIG. 4) is engaged, and rebound is substantially prevented by ratchet 63 shown in FIG. 4. The circuit board 18 is then roughly positioned, being loosely held between side rails 63 as well as by the stop 61 and ratchet 63. (The degree of holding effected by the rails and stops is sufficiently loose to permit the precise positioning by pins 113). At that time, slots 77–79 are disposed above and generally registered with locaters 113 of mechanism 90, 90b and 90c.

As the next step, the air cylinders 101 of the three mechanisms 90, 90b and 90c are operated simultaneously to lift lower frames 93 and thus pins 113. (As shown relative to mechanism 90 in FIG. 9, pin 113 is lifted from the phantom-line position to the full-line position.) During such lifting, the pointed upper ends 120 of pins 113 ensure that the pins will go through the slots 77–79, by effecting any requisite slight side motions of the board 18 which is then still floating on air. Frequently, because there is a substantial clearance between each pin 113 and the walls of the associated slots 77-79, the pins are elevated without creating any drag force whatever on the board 18.

Solenoids 107 of the locater mechanisms are then operated simultaneously to rotate the associated pins 113, for example clockwise as shown in FIGS. 11 and 12, and as far as permitted by the walls of the slots. Thus, each pin 113 shifts from the position shown in FIG. 11 to that shown in FIG. 12 and (relative to the center pin) FIG. 13.

The described rotation effects precise positioning of the board, without any scuffing, and without any damage to the walls of the slots 77-79. As shown in enlarged form in FIG. 13, the corners or edges 118 of the pins do not engage the slot walls, such walls instead being engaged by rounded cam regions 115 of convex walls 116, 117 of the pins. There is, then, no biting of the corners into the slots, no loss of precision, and no tendency for the pins to provide major resistance to downward movement of board 18 as described below.

It is emphasized, however, that some of the appended claims cover constructions where corners do engage the slot walls, and/or where the locater elements are not solely "pins", but (for example) pins and small cranks, or not "pins" at all. When the pins 113 are rotated as described, the slots 77-79 are correctly positioned relative to the axes of rotation of the pins, regardless of tolerance variations in the widths of the slots. Manufacturing tolerance variations relative to the widths of the slots, are caused to be not a factor. This is extremely important relative to the achievement of precision of exposure of opposite sides of the board so as to prevent rejects (make certain that the circuits on opposite sides of the board are directly opposite each other so that connections may be made through the board despite the fact that the lines are extremely fine).

As shown by the arrows in FIG. 12, the outer pins 113 effect movement of the adjacent board regions toward or away from the guide rail 62, FIG. 4, (as illustrated by the left and right arrows in FIG. 12), while the central pin effects movement of the board generally parallel to the guide rail (as illustrated by the central arrow in such figure).

The solenoid 107 of the central mechanism 90 is rapidly cycled several times, in a period of milliseconds, to effect a low-power "hammering" operation relative to the side walls of its slot. With the "hammering" action, any tendency for the left and right pins 113 to create excessive friction relative to the board, and thus prevent full and effective operation of the central pin 113, is eliminated, yet the voltage applied to each solenoid may be maintained low so as to ensure that (even with the "hammering") the rounded regions of the pins will not bite into or damage the slot side walls.

As the next step, the valve shown in FIG. 2 is operated to change from pressure operation to vacuum (actually, suction) operation, thus sucking the board 18 down into flatwise engagement with the upper (stage) surface of air box wall 22 without causing any scuffing of the board. As above noted, the rounded walls of pins 113 do not provide any substantial impediment to such downward board movement.

Thereafter, the solenoids 107 are deenergized so that the return springs in the solenoids return pins 113 back to their normal or rest positions shown in FIG. 11. The board 18, however, does not move because it is firmly clamped to the wall or stage 22.

Air cylinders 101 are then operated to lower pins 113; the side rails 62 and stop 61, etc., are lowered (as described previously); and the mask (artwork) is lowered preparatory to effecting an exposure. The exposure is then effected. Then, the vacuum is released, air is again introduced to float the board, and movement of the board to the next station follows.

As in the case of the entire apparatus, the above is effected under computer control, automatically, and various sensors and positional switches (not shown) are provided to ensure that everything is in the proper position at all times.

The foregoing detailed description is to be clearly understood as given by way of illustration and example only, the spirit and scope of this invention being limited solely by the appended claims.

What is claimed is:

1. Apparatus for effecting precise positioning of a circuit board preparatory to exposure thereof, said circuit board having a plurality of nonparallel openings therethrough, said apparatus comprising:
    (a) a plurality of board-positioning elements each having a portion adapted to be inserted into one of the nonparallel openings in a circuit board, and when thus inserted to be in loose non-binding relationship relative to the walls of such opening,
        each such portion being noncircular in the plane of said circuit board,
        each such portion being so shaped and sufficiently large, in the plane of said circuit board, that when such portion is rotated it will engage the walls of such opening to thereby shift and position said circuit board in said plane, and
    (b) means to effect rotation of said board-positioning elements and cause such portions to thus shift and position said board.

2. Apparatus for effecting precise positioning of a circuit board preparatory to exposure thereof, said circuit board having three slots therethrough, one of said slots extending in one direction, two of said slots extending in directions perpendicular to said one direction, each of said slots having generally parallel side walls, said apparatus comprising:
    (a) three positioning elements each having a portion adapted to be inserted into one of said slots,
        each such portion being noncircular in the plane at said board, each such portion being so shaped and sufficiently small, in the plane of said board, that when said positioning elements are in predetermined rotated positions about axes transverse to said board, said portions may be inserted freely into said respective slots, and when thus inserted will be relatively loose and non-binding in said respective slots, but will not be sufficiently loose that said portions may rotate more than a partial revolution about said axes,
        each such portion having two regions on opposite sides of its associated one of said axes,
            said regions being so shaped and positioned that when said positioning elements are rotated about said axes through angles as large as are permitted by the walls of said slots, said regions will engage and move said walls, and said board will be in a known position relative to said axes, and
    (b) means to effect said rotations of said elements about said axes through angles as large as are permitted by said walls of said slots.

3. In a system for exposing and handling double-sided printed circuit boards, apparatus for effecting highly precise positioning of such boards before each exposure, said apparatus comprising:

(a) three slots formed in each board in predetermined positions, two of such slots being parallel to each other, one of such slots being perpendicular to said parallel slots, each slot having parallel walls, (b) three accurately-positioned locaters respectively adapted to be inserted into said slots, each locater being noncircular, and being cross-sectionally sized and shaped to be loosely received in an associated slot when said locaters are in predetermined rotated positions about the axes of said locaters, said axes being perpendicular to said board, each locater also being so cross-sectionally sized and shaped that the locater may not rotate more than a partial revolution about its axis, further rotation being prevented by engagement of two wall-engagement portions of the locater with opposed walls of the slot, said two wall engagement portions of each locater being disposed equal distances on opposite sides of a first plane containing the locater axis, and also being disposed equal distances on opposite sides of a second plane containing the locater axis, said second plane being perpendicular to said first plane, (c) means to shift said locaters in their axial directions and into said respective slots when said locaters are in said predetermined rotated positions, and (d) means to rotate said locaters about their respective axes to cause said two wall-engagement portions of each locater to engage regions of the opposite walls of the associated slot, said rotation means effecting locater rotation as far as permitted by said slot walls, and thus effecting accurate positioning of said circuit board relative to the axes of said locaters regardless of tolerance variations in the widths of said slots.

4. The invention as claimed in claim 3, in which means are provided to effect air-flow floating of said circuit board above said locaters, in which means are provided to effect said locater shifting and locater rotation while a circuit board is air-flow floating about said locaters, and in which means are provided to interrupt said air-flow floating and substitute suction therefor, which suction sucks said board downwardly onto a supporting surface and causes downward sliding of the slot walls relative to said wall-engagement portions, whereby said board engages and is suction clamped to said surface in accurately-positioned relationship and in the absence of any scuffing.

5. The invention as claimed in claim 3, in which said wall-engagement portions are rounded cam surfaces that will not bite substantially into the slot walls.

6. The invention as claimed in claim 3, in which each locater is a pin having generally cylindrical opposed convex surfaces which are mirror images relative to a plane disposed midway between said surfaces and containing the axis of such pin, each of said convex surfaces having portions which are mirror images about a second plane containing said axis and perpendicular to said first-mentioned plane, said surfaces being sufficiently far from each other that upon rotation of said pin the walls of the slot in which said pin is mounted will be engaged by wall-engagement portions of said curved surfaces and not by any edges or corners thereof.

7. The invention as claimed in claim 6, in which the ends of said pins are relatively pointed to facilitate insertion of said pins into said slots.

8. The invention as claimed in claim 3, in which means are provided to cycle one of said locaters rotationally, to create a "hammering" effect which permits low locater torque to be applied while still assuring that friction generated by certain of said locaters will not prevent accurate positioning of said board.

9. The invention as claimed in claim 8, in which said cycling means is associated with a central one of said locaters, said central one of said locaters being in said one slot, the remaining two locaters being in said slots which are parallel to each other.

10. The invention as claimed in claim 3, in which said one slot is disposed between said two parallel slots and spaced from each.

11. A method of achieving precision registry of a printed circuit board of the type having slots provided therein in non-parallel relationship, and without tending to widen said slots at any point and without tending to effect any substantial dragging of said circuit board in a direction perpendicular thereto, said method comprising:

(a) inserting into each of said slots a positioning element which is noncircular and which is sufficiently small to fit loosely in such slot when said positioning element is in a predetermined rotated position about an axis perpendicular to said circuit board, and (b) rotating said positioning elements about their respective axes to cause binding of said positioning elements against the side walls of said slots and thereby effect positioning of said circuit board relative to the axes of said positioning elements.

12. In a method of exposing and handling double-sided printed circuit boards of the type having non-parallel slots therein adapted to receive positioning elements, the steps of accurately positioning said circuit boards at exposure stations without enlarging said slots, without having the accuracy of the positioning diminished because of tolerance variations in the widths of said slots, and without effecting any scuffing of the surfaces of said circuit boards, said method comprising:

(a) effecting air-floating of each circuit board at a position at which the slots thereof are above positioning-element locations, (b) effecting, while said floating of said board is continued, upward movement of positioning elements that are noncircular and fit loosely into said slots when said positioning elements are in predetermined rotated positions about their axes, (c) effecting rotation of said elements about their axes, as far as permitted by the walls of said slots, to cause binding of slot wall-engaging regions of said elements relative to the walls of their associated slots and thus cause accurate positioning of said board, (d) discontinuing said air-floating action, (e) drawing a vacuum beneath said board to suck said board down onto an exposure stage, and then (f) unrotating said elements and lowering them out of said slots.

* * * * *